(12) United States Patent
Shariff et al.

(10) Patent No.: US 8,115,145 B2
(45) Date of Patent: Feb. 14, 2012

(54) SYSTEMS AND METHODS FOR BASE STATION ENCLOSURES

(75) Inventors: Zia Shariff, Toronto (CA); Andrew Hudz, Etobicoke (CA); Anthony Cormick Sharp, Scarborough (CA)

(73) Assignee: Sanmina-SCI Corporation, San Jose, CA (US)

( * ) Notice: Subject to any disclaimer, the term of this patent is extended or adjusted under 35 U.S.C. 154(b) by 923 days.

(21) Appl. No.: 11/720,435

(22) PCT Filed: Nov. 29, 2005

(86) PCT No.: PCT/US2005/043254
§ 371 (c)(1),
(2), (4) Date: Jun. 5, 2008

(87) PCT Pub. No.: WO2006/058342
PCT Pub. Date: Jun. 1, 2006

(65) Prior Publication Data
US 2009/0008076 A1    Jan. 8, 2009

Related U.S. Application Data

(60) Provisional application No. 60/631,753, filed on Nov. 29, 2004.

(51) Int. Cl.
*H05B 1/02* (2006.01)

(52) U.S. Cl. ........ 219/501; 219/209; 219/494; 219/522; 165/248; 165/253

(58) Field of Classification Search .......... 219/490–494, 219/497, 506–508, 553, 209–210, 520–522; 165/22, 16, 248, 253
See application file for complete search history.

(56) References Cited

U.S. PATENT DOCUMENTS

| | | |
|---|---|---|
| 1,877,011 A | 9/1932 | Modine |
| 3,046,758 A | 7/1962 | Heuer |
| 3,749,981 A | 7/1973 | Koltuniak et al. |
| 3,810,509 A | 5/1974 | Kun |
| 4,269,267 A | 5/1981 | Labrande |
| 4,535,386 A | 8/1985 | Frey, Jr. et al. |
| 4,691,766 A | 9/1987 | Wurz et al. |
| 4,776,385 A | 10/1988 | Dean |

(Continued)

FOREIGN PATENT DOCUMENTS

TW    547708    8/2003

OTHER PUBLICATIONS

International Search Report for PCT Application No. PCT/US05/43254, Sanmina-SCI Corporation, Oct. 17, 2007.

(Continued)

*Primary Examiner* — Mark Paschall
(74) *Attorney, Agent, or Firm* — Perkins Coie LLP

(57) ABSTRACT

A technique for climate control of, for example, base station circuitry within an enclosure involves placing base station circuitry within the enclosure and controlling the climate therein. A system according to this technique includes an enclosure suitable for use outside in a wide range of extreme weather conditions. A controller may, for example, control a fan tray with a heater to pull ambient air through a filtration unit, through the fan tray where the air is heated, and through cold start recirculation dampers.

7 Claims, 9 Drawing Sheets

U.S. PATENT DOCUMENTS

| | | | |
|---|---|---|---|
| 4,815,531 A | 3/1989 | Presz, Jr. et al. | |
| 4,840,225 A | 6/1989 | Foley et al. | |
| 4,841,733 A | 6/1989 | Dussault | |
| 4,858,069 A | 8/1989 | Hughes | |
| 5,042,576 A | 8/1991 | Broadbent | |
| 5,398,159 A | 3/1995 | Andersson et al. | |
| 5,501,270 A | 3/1996 | Young et al. | |
| 5,548,643 A | 8/1996 | Dalgleish et al. | |
| 5,655,595 A * | 8/1997 | Westbrooks, Jr. | 165/48.1 |
| 5,862,982 A | 1/1999 | Federspiel | |
| 5,894,407 A | 4/1999 | Aakalu et al. | |
| 6,076,739 A | 6/2000 | Littleford et al. | |
| 6,127,663 A * | 10/2000 | Jones | 219/553 |
| 6,295,823 B1 | 10/2001 | Odom et al. | |
| 6,672,375 B1 | 1/2004 | Shippy et al. | |
| 6,775,137 B2 | 8/2004 | Chu et al. | |
| 6,857,468 B2 | 2/2005 | Emrich | |
| 6,963,980 B1 | 11/2005 | Mattsson | |
| 7,325,129 B1 | 1/2008 | Mattsson et al. | |
| 7,414,842 B2 | 8/2008 | Hao et al. | |
| 2002/0134544 A1 | 9/2002 | DeVilbiss et al. | |
| 2004/0168456 A1 | 9/2004 | Chiang et al. | |
| 2004/0200608 A1 | 10/2004 | Baldassarre | |
| 2004/0217072 A1 | 11/2004 | Bash et al. | |
| 2005/0121176 A1 | 6/2005 | Emrich | |
| 2007/0097654 A1 | 5/2007 | Hao et al. | |
| 2007/0295492 A1 | 12/2007 | Sharp et al. | |
| 2008/0017360 A1 | 1/2008 | Campbell et al. | |
| 2009/0008076 A1 | 1/2009 | Shariff et al. | |
| 2009/0036167 A1 | 2/2009 | Sterner | |

OTHER PUBLICATIONS

International Search Report PCT/US2005/043253 dated Jun. 19, 2006.

* cited by examiner

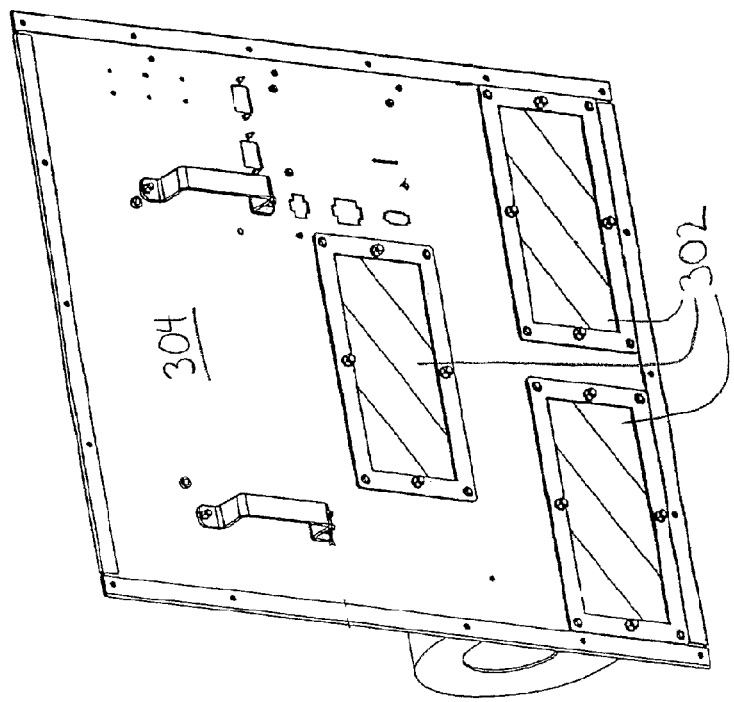

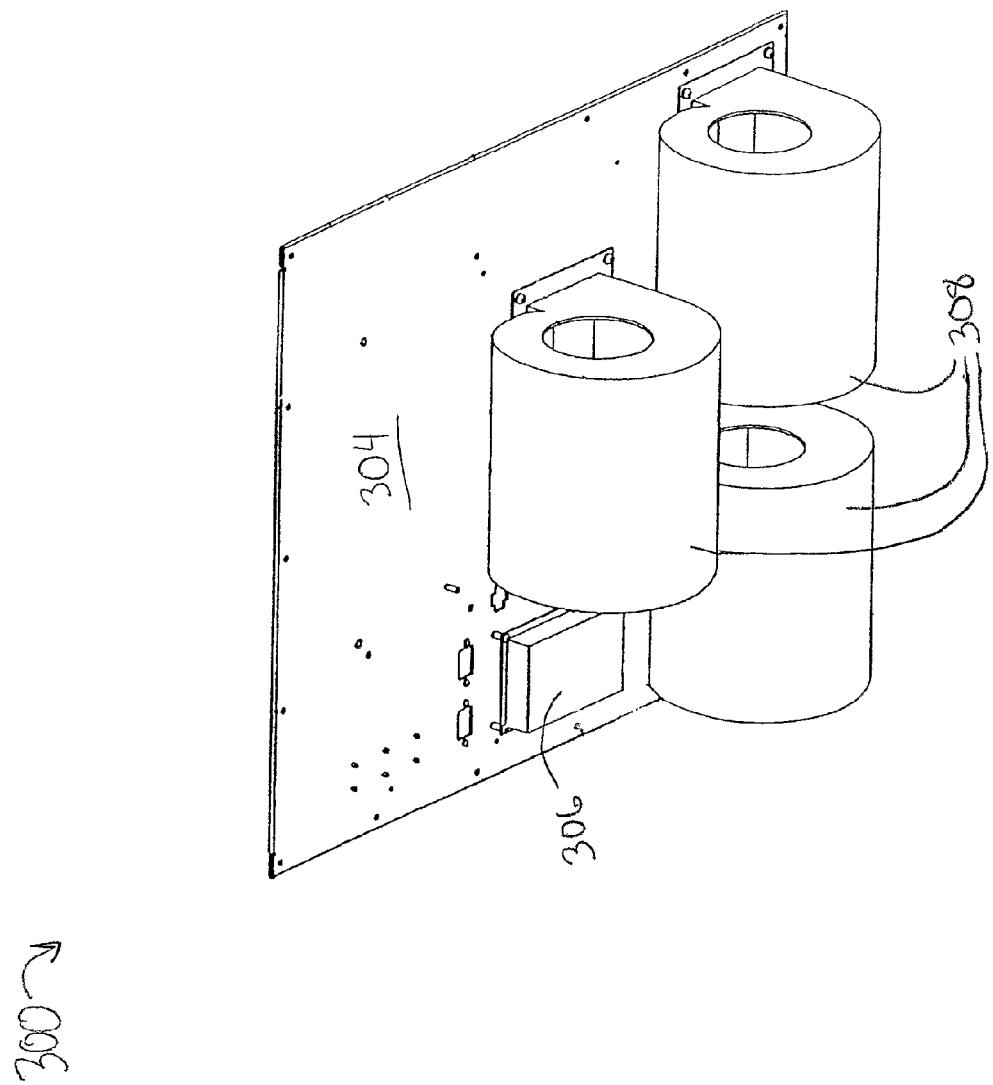

SYSTEMS AND METHODS FOR BASE STATION ENCLOSURES

BACKGROUND

This application relates generally to communications equipment. In particular, the invention is related to thermal management of base stations.

Base stations are transmission and reception stations for handling cellular traffic. Base stations may be fixed or mobile. In the communications fields, there are many kinds of base stations, including Base Transceiver Stations (BTS's), Cellular Base Stations, 3G Mobile Base Stations, 3G Base Stations, Wireless Network Base Stations, Basestations, Fixed Cellular Base Stations, UMTS Base Stations, Code-Division Multiple Access (CDMA) Base Stations, Global System for Mobile Communications (GSM) Base Stations, Radio Base Stations, and others. A base station handles transmission and reception of wireless traffic for a geographic area, and multiple base stations within the geographic area form a wireless network. Along with voice services, data services such as Short Message Service (SMS), e-mail, and Internet browsing may be provided by the base station to mobile devices.

Of particular importance with base stations is reliability. Base stations often have to run 24 hours a day, even in severe weather. Moreover, in operation, base station circuitry generates heat, which must be managed to ensure the base station performs properly. In addition, base stations may have a limited amount of power available for consumption, or it may be desirable to operate the device efficiently.

It is possible to construct a base station unit for use in cold areas. However, base station circuitry that is capable of "cold start" is typically expensive. Base stations that are not constructed using a "cold start" technology can be damaged by starting tip the base station when the device is cold, such as when the device has an internal temperature that is below freezing. "Cold start" technology does not ameliorate the need for thermal management at higher temperatures—a necessity to ensure that the base station is not degraded by excess heat buildup.

SUMMARY

A technique for climate control of, for example, base station circuitry within an enclosure involves placing base station circuitry within an enclosure and controlling the climate therein.

A system according to this technique includes an enclosure. According to a non-limiting embodiment, the enclosure is suitable for use outside in a wide range of extreme weather conditions. Extreme weather conditions may include, for example, extreme heat, extreme cold, high winds, or any form of precipitation, such as snow or rain. In a non-limiting embodiment, the enclosure may be divided into two compartments. Additional compartments are possible, but would likely increase the cost of a unit.

In a non-limiting embodiment, the system may include doors to each compartment of the enclosure. For example, a first door may be operationally coupled to the enclosure such that a first of the two compartments can be opened. The first door may include, for example, one or more of a controller, a filtration unit for filtering particles and/or water droplets from air, a fan tray with a heater for drawing in and heating air, and one or more cold start recirculation dampers for controlling the flow of heated air. A second door may, for example, be operationally coupled to the enclosure such that a second of the two compartments can be opened.

In a non-limiting embodiment, the system may include communications equipment, suitable for use indoors over a limited temperature range, within the first compartment. The system may further include a rectifier unit within the second compartment.

In a non-limiting embodiment, in operation, the controller controls the fan tray with a heater to pull ambient air through the filtration unit, through the fan tray where the air is heated, and through the cold start recirculation dampers. A first portion of the heated air may contact the communications equipment and a second portion of the heated air may contact the rectifier unit as the air passes through the first compartment and the second compartment, respectively. When a portion of the communications equipment passes a lower threshold temperature, the communications equipment may be started, thereby preventing the communications equipment from starting at a temperature that is sufficiently cold to potentially damage components of the communications equipment. When a portion of the communications equipment passes an upper threshold temperature the controller may increase the speed of the fans in the fan tray, thereby drawing more ambient air through the filtration unit to prevent the communications equipment from overheating.

A device according to the technique may reside within, for example, a rectifier unit. In a non-limiting embodiment, the device may include a first thermistor input associated with an input air flow, a second thermistor input associated with an exhaust air flow, a fan control output, a heater control output, and a controller capable of coupling to a first thermistor through the first thermistor input, a second thermistor through the second thermistor input, one or more fans through the fan control output, and one or more heaters through the heater control output. In operation, the controller may turn on at least one of the heaters when the first thermistor senses a first cold temperature and the second thermistor senses a second cold temperature, turn off the heaters when the second thermistor measures a warm temperature, and adjust the speed of the fans based upon the temperature sensed by the second thermistor, wherein fan speed is generally higher when the temperature sensed by the second thermistor is higher.

A method according to the technique may include, for example, receiving a start stimulus for base station circuitry within a compartment of an enclosure, determining a first temperature at an air intake location of the enclosure, determining a second temperature at an air exhaust location of the enclosure, and pre-heating the compartment if the first temperature is below a first threshold and the second temperature is below a second threshold. The method may further include heating, after a delay period, the compartment if the first temperature is below a third threshold and the second temperature is below the second threshold. The method may further include heating with an additional heater, after the delay period, the compartment if the first temperature is below a fourth threshold and the second temperature is below the second threshold.

BRIEF DESCRIPTION OF THE DRAWINGS

Embodiments of the invention are illustrated in the figures. However, the embodiments and figures are illustrative rather than limiting; they provide examples of the invention.

FIGS. 3A and 3B depict an example of a fan tray for use in the base station enclosure of FIG. 1.

In the figures, similar reference numerals may denote similar components.

DETAILED DESCRIPTION

Figure 1:
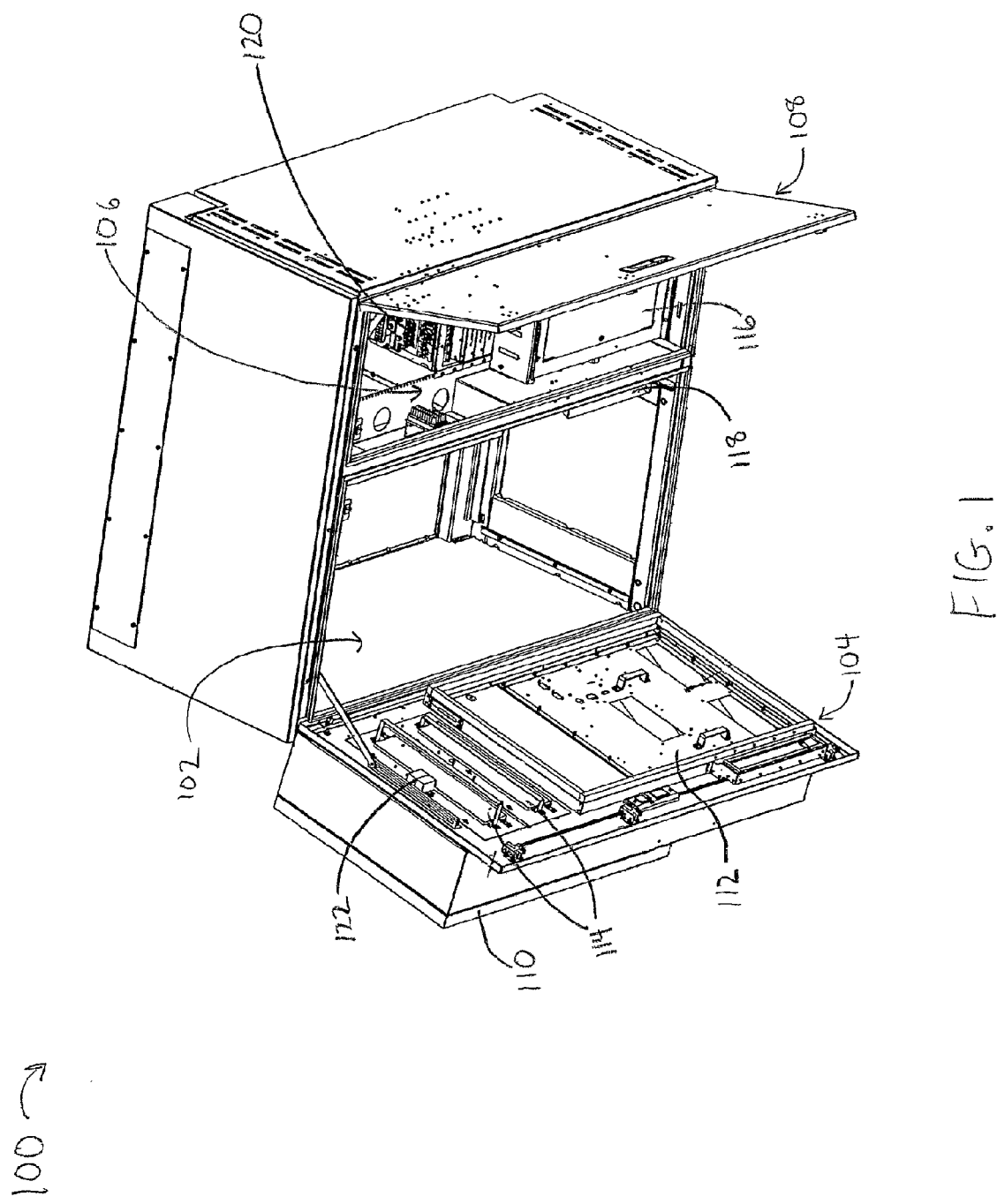
FIG. 1 depicts an example of a base station enclosure.

FIG. 1 depicts an example of a base station enclosure 100. In the example of FIG. 1, the base station enclosure 100 includes a first compartment 102 with a door 104 and a second compartment 106 with a door 108. In a non-limiting embodiment, communications circuitry (not shown) is enclosed in the first compartment 102. Temperature sensing devices, such as thermistors are placed at various locations around the enclosure, such as at an air inlet into the enclosure, at an air exhaust, and at other locations within the enclosure. In a non-limiting embodiment, fan and heater functions are based on the temperature readings from two Negative Temperature Coefficient (NTC) thermistor sensors, placed in an inlet airstream and at the exhaust, as described later with reference to FIG. 5. In the example of FIG. 1, one such thermistor is depicted (thermistor 122), but at least one other thermistor (not shown) is assumed.

In the example of FIG. 1, the door 104 includes an access panel 110, a fan tray 112, and dampers 114. In a non-limiting embodiment, the access panel 110 provides access to a filter (such as the filter 200 depicted in FIG. 2). The filter may prevent particles or water droplets from entering the enclosure. This is considered exceptionally valuable for the base station enclosure 100 because the base station enclosure 100 should be capable of outdoor operation under a wide variety of extreme weather conditions. Extreme weather conditions may include, for example, extreme heat, extreme cold, high winds, or any form of precipitation, such as snow or rain. For this reason, the filter is of relatively high quality and, potentially, relatively high cost. In systems designed for indoor use, on the other hand, the filter need not prevent water droplets from entering the enclosure, reducing the need for and desirability of the access panel 110. In a non-limiting embodiment, a pressure sensor or some other sensor may determine that the filter is clogged and trigger an alarm.

The fan tray 112 facilitates circulation of air. FIGS. 3A and 3B depict an example of a fan tray 300 that may be placed in the door 104. The fan tray 112 may include multiple fans and heaters. In a non-limiting embodiment, the controlling inputs and outputs of the fans may be operated individually. In a non-limiting embodiment, the fans are an R1G133-DC13 type, speed controlled by a 0-10V control signal (realized as 0-12V/1.8 KHz+/−10% PWM), having rotational feedback, RPM (3 pulses/rotation). This is but one of many fan types that could be used, as would be apparent to one of ordinary skill in the relevant art. In a non-limiting embodiment, the speed of the fan depends upon the exhaust temperature of the enclosure 100, as is described later with reference to FIG. 5.

In a non-limiting embodiment, RPM feedbacks from the fans are used for generating a fan alarm when no rotational pulses are seen when expected, RPM below 400. By switching to 30% PWM speed, the fan speed may temporarily be higher to perform a "kick start" of the fans.

In a non-limiting embodiment, the fan tray 112 includes two heaters powered from one 240 VAC mains input—type SGA1J17RW10 rated 1000 W @ 240 VAC each. In a non-limiting embodiment, a separate heater control is used for pre-heating: three 300 W heaters in parallel, one for each of three fans. These may be supplied, for example, from a separate 240 VAC mains input. The heaters may be switched on and off depending upon temperature readings within or near the enclosure 100, as is described later with reference to FIG. 5.

In a non-limiting embodiment, each heater is current monitored and no current flow when expected will initiate a heater alarm. Alarm limits for heaters are current below/above 2 A+/−25% when expected/not expected. In a non-limiting embodiment, the heater operation range is from −40 to 0 degrees C. It may be desirable to extend the range further below 0 (to −50, −60 or less). However, it is not considered necessary to increase the range since known circuitry can operate without degradation at 0 degrees C. If it were the case that circuitry worked better at higher temperatures, of course the upper range could be increased to take advantage.

The dampers 114 facilitate heating the inside of the enclosure 100 in cold environments. For this reason, the dampers 114 may be referred to as "cold start" dampers. In extremely cold environments, additional dampers may be used. In less cold environments, fewer or no dampers could be used. The dampers 114 help recirculate air within the enclosure 100 so that the heated air is not vented immediately. This is advantageous because certain components should not be started at very low temperatures. The dampers 114 have proven to be effective at temperatures as low as −40 degrees C. When internal temperatures of the enclosure 100 reach a threshold temperature, such as, by way of example but not limitation, 5 degrees C., the dampers 114 may be closed.

In the example of FIG. 1, the enclosure 100 includes a battery compartment 116, a battery air inlet 118, and a control module 120. The battery compartment 116 is optional. In an alternative embodiment, a battery could be located external to the enclosure 100. Alternatively, a battery could be located in a third compartment of the enclosure or in a separate enclosure. In any case, it is desirable to include an exhaust port for the battery since the battery may outgas, for example, hydrogen. Since the enclosure 100 includes a circulatory system, as described above, the circulatory system can serve the dual function of exhausting air that passes through the battery compartment 116.

The battery air inlet 118 forces some air toward the battery compartment 116. In the example of FIG. 1, the air can pass over or through the battery compartment 116, past the control module 120 (which may generate some heat—and might benefit from the air passing over it), over other electronic components, if any, and out an exhaust vent (not shown) or through the dampers 114 to be recirculated.

The control module 120 controls certain functions of the enclosure 100. The control module 120 could be broadly interpreted as including all control components of the enclosure 100. For illustrative purposes, however, the control module 120 is treated as a device, such as a microprocessor control board, within the second compartment 106. It should be understood that controllers could be placed within the door 104 to control the fan tray 112, the cold start dampers 114, and/or other components. In a non-limiting embodiment, the control module 120 provides the instructions to the controller within the door 104, which controls the fan tray 112. Certain functions of the control module are described later with reference to FIG. 5.

In a specific non-limiting embodiment, the control module 120 may include a Direct Air Cooling System (DACS) Printed Circuit Board (PCB). The PCB may be 100×150 mm with component heights that are max. 25 mm, excluding PCB material and component leads. Four holes 4.5 mm spaced 90×140 mm are available for mounting, positioned 5×5 mm from each corner. On conduction surfaces, standoffs, height not less than 12 mm, may be used for mounting the PCB to ensure electrical safety distance. Also a distance of not less than 8 mm should be kept from the PCB left/top side to a conduction surface. In this specific non-limiting embodiment, the PCB may be designed to meet all specifications as described in SANMINA-SCI specification point 4.5, 5.2 and 6.3. Plastic materials may be selected to meet UL94V-0.

In a non-limiting embodiment, the enclosure 100 is modifiable into at least two versions of heat management systems: The standard option and the severe weather option. In the standard option no heater or inlet air temperature sensor are necessary and may be omitted.

In a non-limiting embodiment, the base station enclosure 100 may be referred to as an outdoor base station enclosure having a first compartment and a second compartment. All of the components of the enclosure that facilitate circulation or recirculation of air may be referred to collectively as a circulation unit operationally coupled to the outdoor base station enclosure. In a non-limiting embodiment, a base station configured for indoor use may be located inside the first compartment. In a non-limiting embodiment, a rectifier unit may be located inside the second compartment. In operation, the rectifier unit controls the circulation unit to draw in ambient air and circulate the air through the first compartment and the second compartment.

Figure 2:
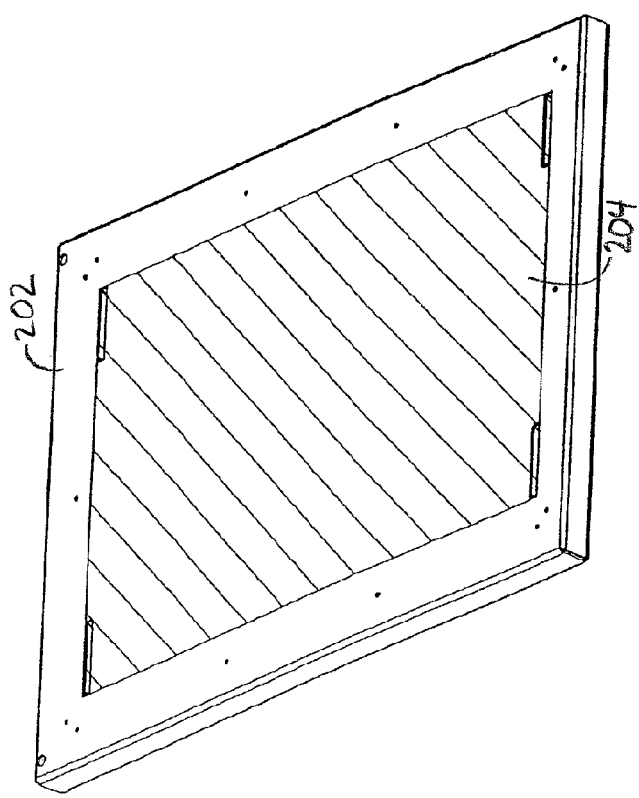
FIG. 2 depicts an example of a filter for use in the base station enclosure of FIG. 1.

FIG. 2 depicts an example of a filter 200 for use in the base station enclosure 100 (FIG. 1). In the example of FIG. 2, the filter 200 includes a filter frame 202 and a filter cover 204. A mesh screen (not shown) may be placed underneath the filter cover 204 and fastened to the filter frame 202. A typical filter 200 may be removed from, for example, the access panel 110 (FIG. 1) for periodic, e.g., annual, cleaning or replacement.

FIGS. 3A and 3B depict an example of a fan tray 300 for use in the base station enclosure 100 (FIG. 1). In the example of FIG. 3A, the fan tray 300 includes three air inlets 302 on a fan tray panel 304. In the example of FIG. 3B, the fan tray 300 includes a controller 306. Heaters (not shown) are attached to or placed near the contraptions 308, which are attached to the fan tray panel 304. The contraptions 308 may include, by way of example but not limitation, blowers such as axial blowers. The heated air passes through the air inlets 302 and into the enclosure 100.

Figure 4:
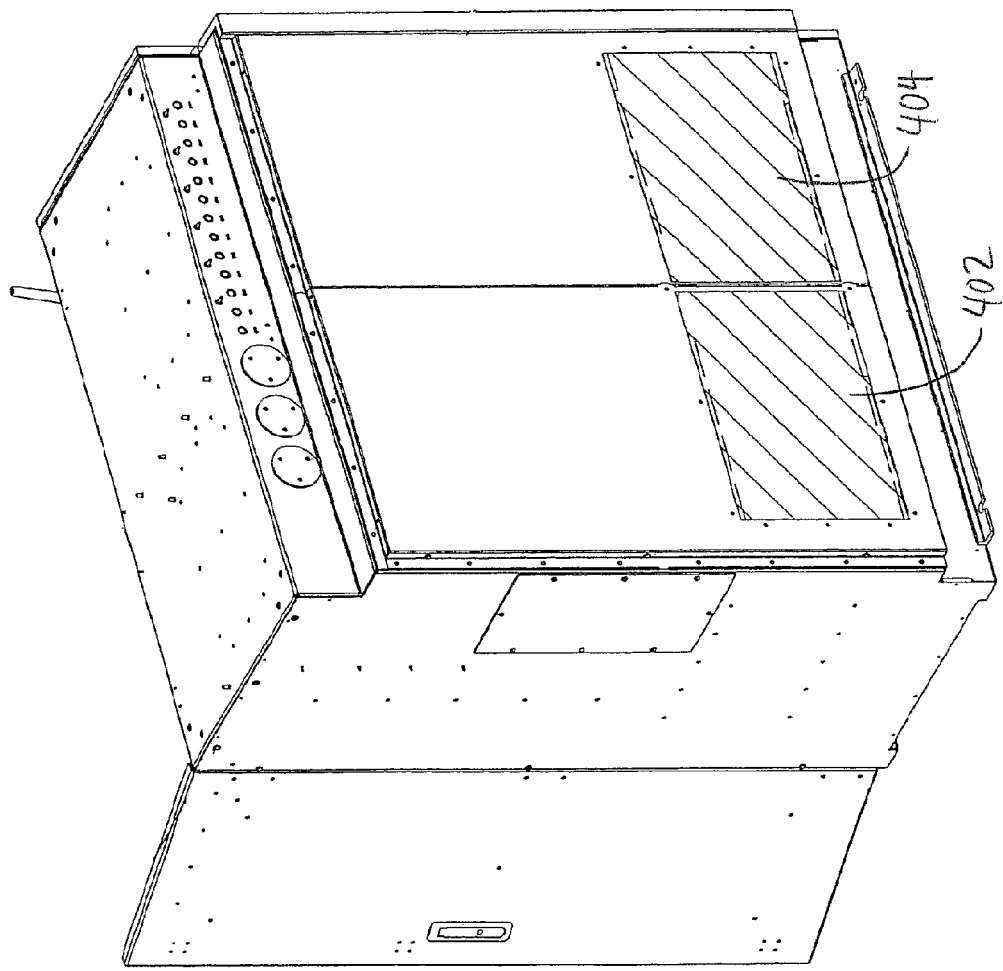
FIG. 4 depicts an example of a base station enclosure.

FIG. 4 depicts an example of a base station enclosure 400. The enclosure may be similar to the enclosure 100 of FIG. 1. In the example of FIG. 4, the enclosure 400 includes a battery exhaust 402 and a base station exhaust 404. In a non-limiting embodiment, thermistors (not shown) are located inside the enclosure 400 near the base station exhaust 404 and/or the battery exhaust 402.

Figure 5:
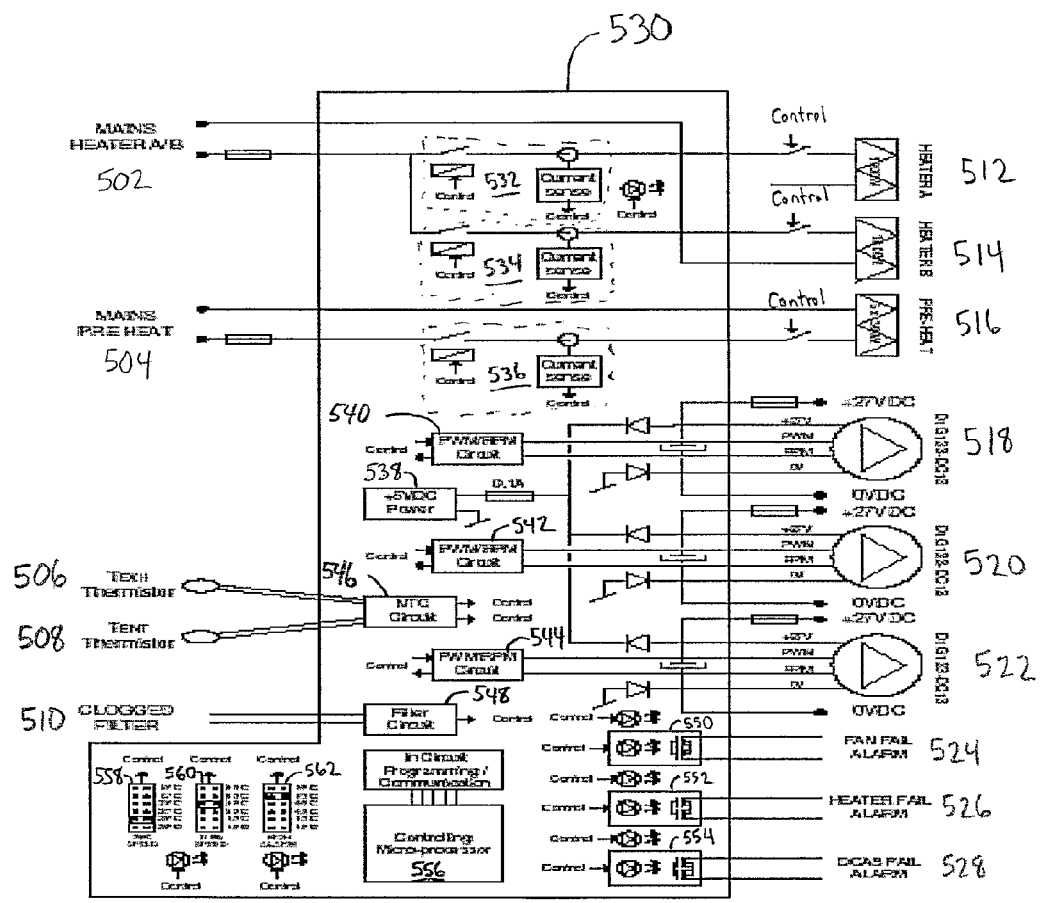
FIG. 5 depicts an example of a control module for use in the base station enclosure of FIG. 1.

FIG. 5 depicts an example of a control module 500 for use in the base station enclosure 100 (FIG. 1). The control module 500 includes heater inputs 502, pre-heater inputs 504, exhaust temperature input 506, air intake temperature input 508, clogged filter input 510, heater outputs 512, heater outputs 514, pre-heater outputs 516, fan outputs 518, fan outputs 520, fan outputs 522, fan fail alarm outputs 524, heater fail alarm outputs 526, and DACS fail alarm outputs 528. In the example of FIG. 5, the inputs and outputs 502 to 528 are coupled to a circuit board 530. The circuit board 530 includes heater control circuit 532, heater control circuit 534, pre-heater control circuit 536, VDC power source 538, fan control circuit 540, fan control circuit 542, fan control circuit 544, NTC circuit 546, filter circuit 548, fan alarm circuit 550, heater alarm circuit 552, DCAS alarm circuit 554, processor 556, six-position jumper field 558, six-position jumper field 560, six-position jumper field 562, and other components.

In operation, the processor 556 receives a start stimulus. The NTC circuit 546 receives signals from the exhaust temperature input 506 and the air intake temperature input 508, which may directly affect control signals.

The control signals may or may not cause the pre-heater control circuit 536 to close between the heater inputs 504 and the pre-heater outputs 516. For example, the pre-heater control circuit 536 may remain open (preventing pre-heating) if the exhaust input temperature input 506 is associated with a temperature of 10 degrees C. or higher. If this is not the case, and the air intake temperature input 508 is associated with a temperature that is below, for example, 0 degrees C., the pre-heater control circuit 536 may close (thereby allowing the pre-heater to receive power).

The control signals may or may not cause the heater control circuit 534 to close between the heater inputs 502 and the heater outputs 514. For example, the heater control circuit 534 may remain open for a specified duration (regardless of sensed temperatures). In a non-limiting embodiment, the period of time may be set to 30 seconds or to some other duration. Advantageously, this prevents activation of heaters unnecessarily, since the pre-heater alone may be able to provide sufficient warmth.

When the duration expires, the control signals still may or may not cause the heater control circuit 534 to close between the heater inputs 502 and the heater outputs 514. For example, the heater control circuit 534 may remain open (preventing heating) if the exhaust input temperature input 506 is associated with a temperature of 10 degrees C. or higher. If this is not the case, and the air intake temperature input 508 is associated with a temperature that is below, for example, −10 degrees C., the heater control circuit 534 may close (thereby allowing the heater to receive power).

The control signals may or may not cause the heater control circuit 532 to close between the heater inputs 502 and the heater outputs 512. For example, the heater control circuit 532 may remain open for a specified duration (regardless of sensed temperatures). In a non-limiting embodiment, the period of time may be set to 30 seconds or to some other duration. This duration may be the same as, or in alternative embodiments, different from the duration set with respect to heater control circuit 534. For example, the heater control circuit 534 could close at the same time as the heater control circuit 532. Alternatively, the heater control circuit 532 could have a longer period of delay than the heater control circuit 534.

When the duration expires, the control signals still may or may not cause the heater control circuit 532 to close between the heater inputs 502 and the heater outputs 512. For example, the heater control circuit 532 may remain open (preventing heating) if the exhaust input temperature input 506 is associated with a temperature of 10 degrees C. or higher. If this is not the case, and the air intake temperature input 508 is associated with a temperature that is below, for example, −25 degrees C., the heater control circuit 532 may close (thereby allowing the heater to receive power).

Advantageously, staggering the heating requirements in time or based upon temperature may improve efficiency and/or prevent activation of more heaters than is necessary. This may be of significance if power is limited, or if the system is entirely reliant upon battery power.

Figure 6:
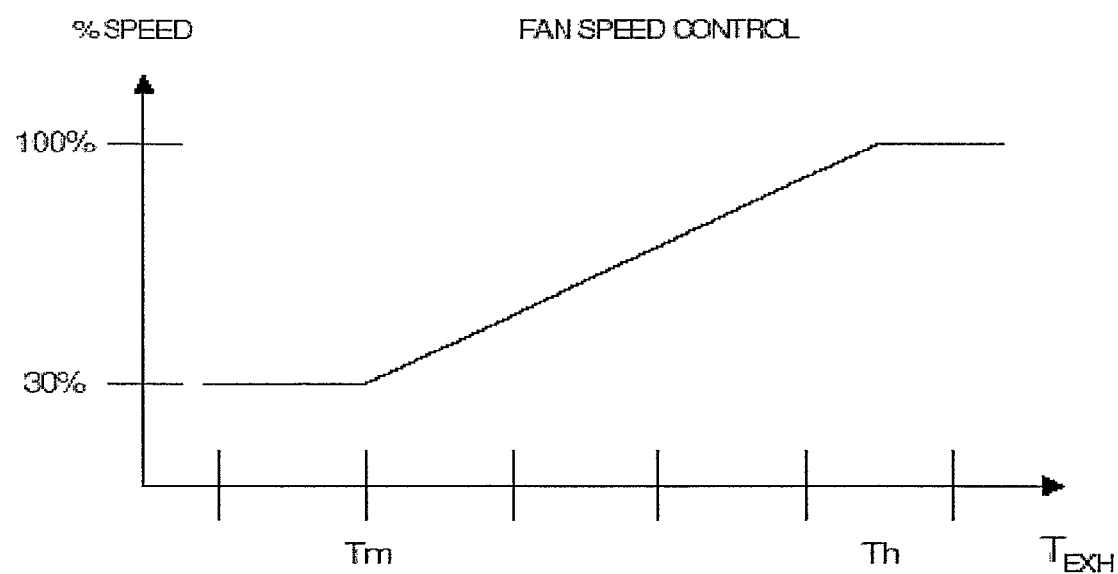
FIG. 6 depicts a graphical illustration fan speed control as temperature increases.

The VDC power source 538 of the circuit board 530 provides power to fans. In a non-limiting embodiment, when the start stimulus is received by the processor 556, the VDC source provides power sufficient to run the fans at 30% speed (the minimum fan speed in this example). The maximum fan speed is, naturally 100% speed. Control signals associated with the NTC circuit 546 cause the fan control circuits 540, 542, 544 to adjust the power provided to the fan outputs 518, 520, 522. In a non-limiting embodiment, the speed of the fans increases above 30% when a minimum temperature threshold, Tm, is passed, and reaches 100% when a high temperature threshold, Th, is reached. The thresholds Tm, Th are based upon the exhaust temperature input 506. In a non-limiting embodiment, Tm and Th are selected by jumper settings on two six-position jumper fields 558, 560. In the example of FIG. 5, the jumper settings associated with Tm range from 20 to 45 degrees C. and the jumper settings associated with Th range from 40 to 65 degrees C., both in 5 degree increments. In a non-limiting embodiment, setting Th lower or equal than Tm will result in Th set to Tm+5 degrees. FIG. 6 depicts a graphical illustration fan speed control as temperature increases.

Referring once again to FIG. 5, the fan alarm circuit 550 of the circuit board 530 receives input associated with fans (such as too little or too much power) and triggers an alarm signal on the fan fail alarm outputs 524 if a problem is detected. Similarly, the heater alarm circuit 552 receives input associated with heaters and triggers an alarm signal on the heater fail alarm outputs 526 if a problem is deteced. The DCAS alarm circuit 554 of the circuit board 530 may trigger an alarm signal on the DCAS fail alarm outputs, according to the setting of the six-position jumper field 562. In the example of FIG. 5, the six-position jumper field 562 has a range of 40 to 65 degrees C., in 5 degree increments.

Figure 7:
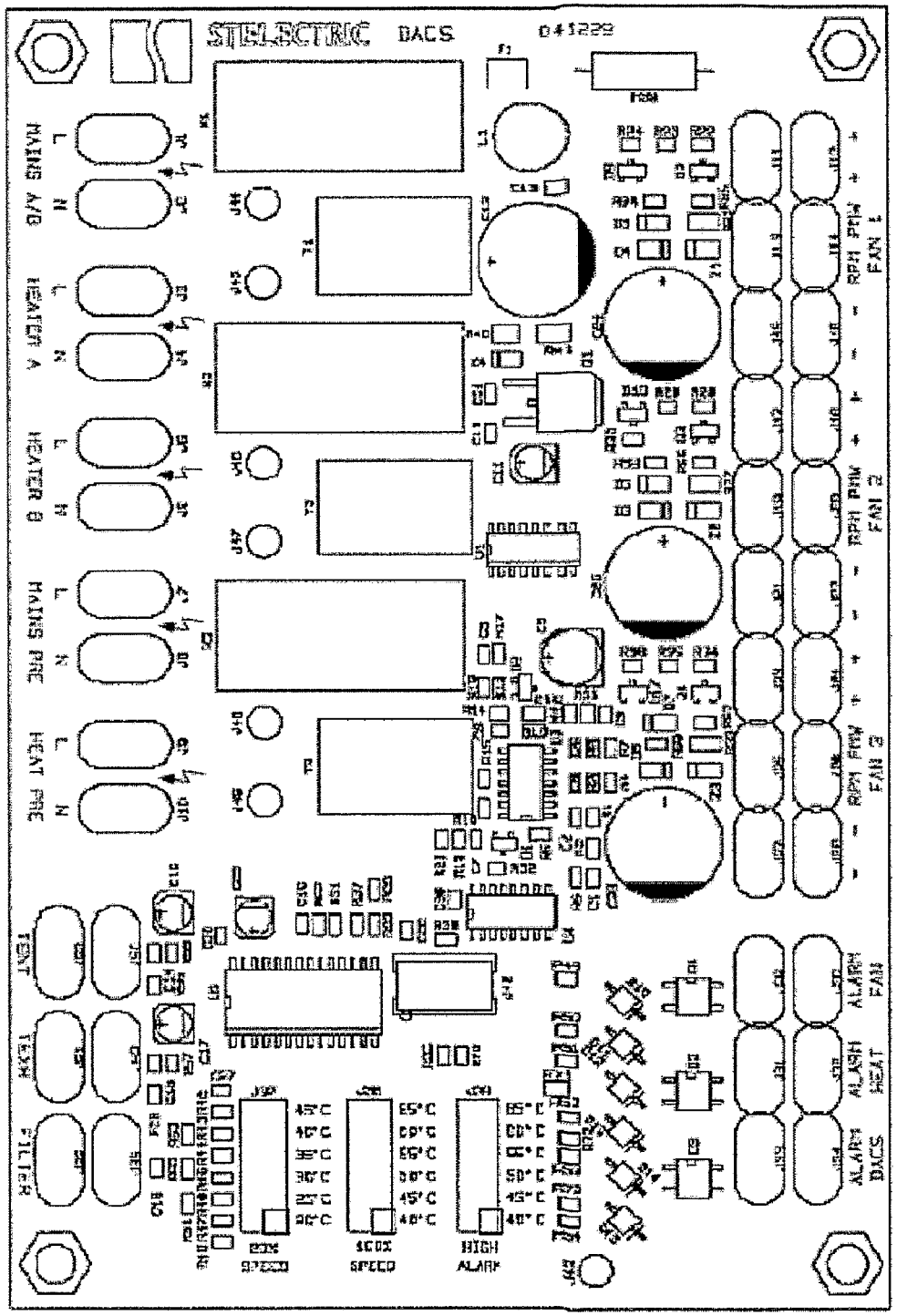
FIG. 7 depicts an example of a circuit board suitable for use in the base station enclosure of FIG. 1.

FIG. 7 depicts an example of a circuit board 700 suitable for use in the base station enclosure 100 (FIG. 1). The circuit board 700 may be similar to the circuit board 530 (FIG. 5); one of skill in the relevant arts would understand the correlation between the circuit board 700 and the circuit board 530. Accordingly, a detailed description of FIG. 7 is omitted.

Figure 8:
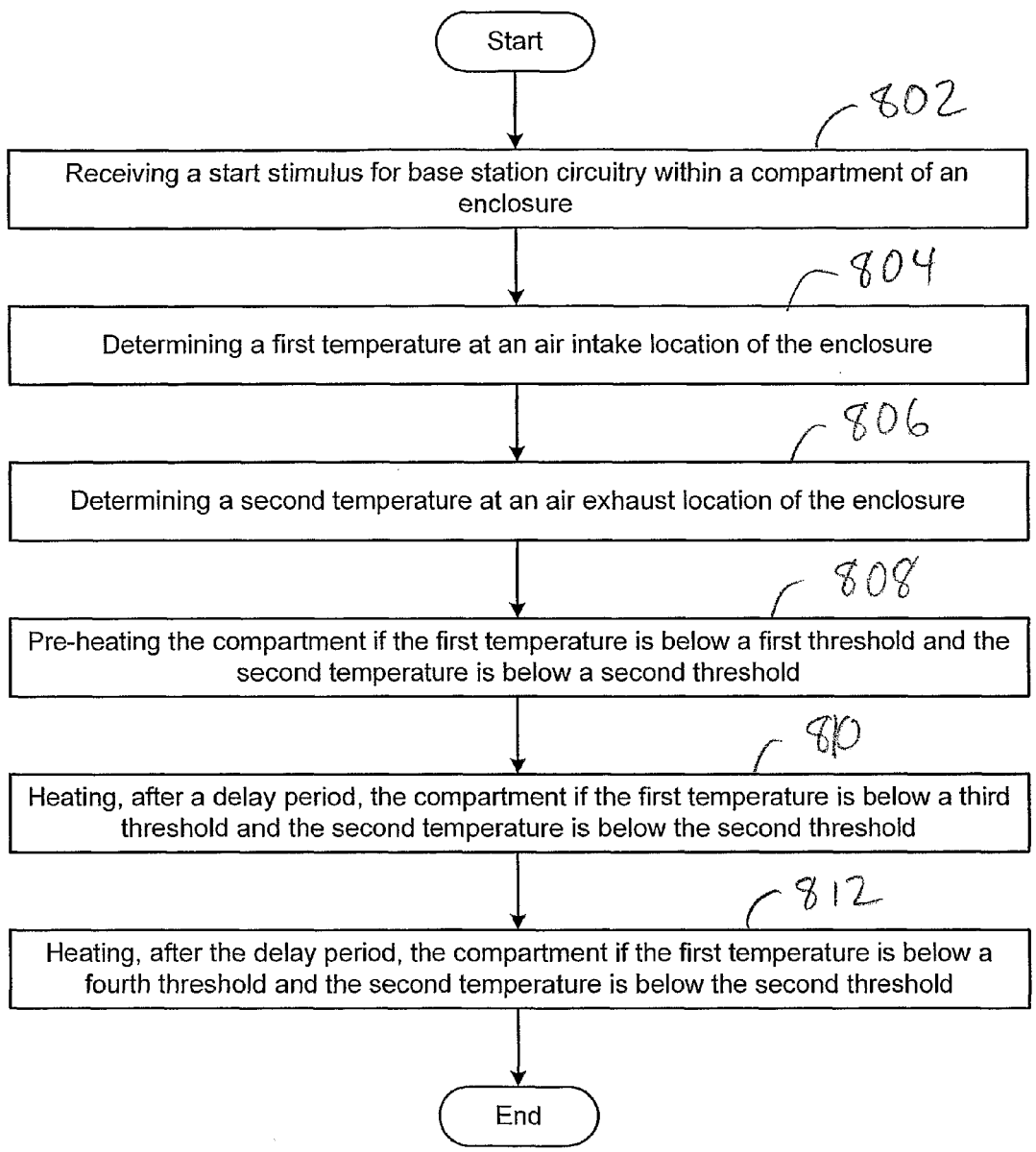
FIG. 8 depicts a flowchart of a method for climate control in an enclosure.

FIG. 8 depicts a flowchart 800 of a method according to an embodiment. This method and other methods are depicted as serially arranged modules. However, modules of the methods may be reordered, or arranged for parallel execution as appropriate.

In the example of FIG. 8, the flowchart 800 starts at module 802 with receiving a start stimulus for base station circuitry within a compartment of an enclosure. This may involve a person plugging in electronic equipment, flipping a switch, sending a wired or wireless signal, or some other means, whether currently known or not, for turning on a machine.

The flowchart 800 continues at module 804 with determining a first temperature at an air intake location of the enclosure. This may involve placing a thermistor at the air intake location. The thermistor may measure temperature and send the results to a controller. It may be desirable to use dual thermistors for tracking warm and cool temperatures, or this may not be necessary depending upon the techniques relied upon.

The flowchart 800 continues at module 806 with determining a second temperature at an air exhaust location of the enclosure. This may be accomplished in a manner that is similar to that described with reference to module 804.

The flowchart 800 continues at module 808 with pre-heating the compartment if the first temperature is below a first threshold and the second temperature is below a second threshold. If the second temperature is sufficiently high, it means that the air exhausted from the enclosure is already deemed warm enough not to warrant pre-heating. If both the first and the second temperatures are below a threshold, then it may be deemed appropriate to pre-heat a compartment.

The flowchart 800 continues at module 810 with heating, after a delay period, the compartment if the first temperature is below a third threshold and the second temperature is below the second threshold. The delay period ensures that the heater will not be triggered unnecessarily (e.g., the pre-heater may be sufficient to heat the compartment sufficiently). After the delay period, the heater may assist the pre-heater in heating the compartment.

The flowchart 800 ends at module 812 with heating, after the delay period, the compartment if the first temperature is below a fourth threshold and the second temperature is below the second threshold. This facilitates maximum heating the compartment (assuming there are only three heaters) when it is exceptionally cold. Two or more heaters, with any number of delay periods, could be employed in this manner. It is assumed that after heating the compartments, the heaters are turned off and the components themselves, which generate heat, continue to keep the compartment warm. However, this need not be the case. It may be desirable to keep a heater running to make sure the enclosure remains warm.

Specific embodiments of a BTS may have some of the following properties:

1. The BTS operating temperature is −40° C. to +50° C.
2. The BTS can survive, with no permanent degradation or damage, temperatures at 10° C. beyond the specified temperature range.
3. The BTS is specification compliant over the operating relative humidity range of 5% to 95%, non-condensing, and a maximum absolute humidity of 0.024 gram H2O/gram of dry air.
4. The BTS complies with low-level vibration requirements as specified in GR-487-CORE, Sec 3.35.5, GR-487-CORE of which is incorporated herein by reference.
5. The BTS complies with transportation vibration requirements as specified in GR-487-CORE, Sec 3.35.3.
6. The BTS complies with seismic (Zone 4) requirements as specified in GR-63-CORE, Sec 4.4.1.2 and 4.4.1.3, GR-63-CORE of which is incorporated herein by reference.
7. The BTS complies with installation shock requirements as specified in GR-63-CORE, Sec 5.3.2.
8. The BTS complies with handling drop shock requirements as specified in GR-487-CORE, Sec 3.35.1.
9. The BTS complies with rail shock requirements as specified in GR-487-CORE, Sec 3.35.2.
10. The BTS emitted sound level does not exceed 75 dBA in compliance with GR-63-CORE Sec 4.6. (China would like 40-60 dBA)
11. The BTS complies with wind-driven rain intrusion requirements as specified in GR-487-CORE, Sec 3.28.1. (A specified water droplet size and a rain fall rate of 5.8 in/hr. is blown with a 70 mph wind for 30 minutes on each exposed side of the equipment.)
12. The BTS complies with weather tightness requirements as specified in GR-487-CORE, Sec 3.28.4. (The environment seals are exercised 50 times prior to exposure. A fine silica dust is specified to be blown at 60 mph).

13. The BTS complies with surge requirements as specified in 12M09154A49, which is incorporated herein by reference.

14. The BTS complies with corrosion resistance requirements as specified in GR-487-CORE, Sec 3.34.1.

15. The BTS complies with bullet resistance requirements as specified in GR-487-CORE, Sec 3.32.

16. The BTS complies with fire resistance requirements as specified in GR-487-CORE, Sec 3.33. (Combustible material moved back to minimum site clearance.)

17. The BTS complies with construction requirements as specified in UL50 Type 3R and the radio equipment compartment complies with UL50 Type 4X.

18. The BTS complies with Underwriters Laboratories 1950, which is incorporated herein by reference.

19. The BTS has an input voltage range of 177 to 265 VAC. The nominal voltage is 220 VAC. (China would like +/−30%)

20. The BTS utilizes an input frequency range of 47 to 63 Hz.

21. The BTS exhibits a worst case power factor no less than 0.95. Nominal power factor is 0.99.

22. The BTS provides surge suppression per IEEE C62.41 category C3 10 kA 20 kV.

23. The BTS meets all performance requirements with all rectifiers operating in current limiting during battery recharge periods.

24. Under battery powered operation, the batteries are disconnected when the voltage has been reduced to 21.6+/−0.15 volts.

25. When AC power is restored after batteries have been disconnected for low voltage, the batteries are reconnected to the DC voltage line when the voltage reaches 25.1+/−0.15 volts.

26. The BTS has the following enclosure alarms: Major: 2 or more rectifiers; Minor: One rectifier—TCP/Sense Malfunction; Minor: DACs; Minor: Over temperature—Rectifier or Battery; Minor: AC Fail; Minor: AC Surge Protector Fail; Minor: Door—Any Door Opened 27. The BTS does not generate RF voltage exceeding 250 microvolts, conducted back onto the AC power line on any frequency or frequencies within the band 450 kHz to 30 MHz. Compliance with this provision is based on the measurement of the radio frequency voltage between each power line and ground at the power terminals.

28. The BTS nominally supports battery backup of: 0 minutes duration; 80 minutes duration; 160 minutes duration; and 240 minutes duration.

29. The BTS does not support expansion frames or a logical BTS configuration.

30. The BTS supports IS-95, 1X, EV-DO, and EV-DV air interfaces.

31. The BTS supports circuit and packet backhaul.

32. The BTS provides frame access for field replaceable unit maintenance.

33. The BTS majority of I/O connectivity terminates at the I/O plate of the SC4812T Lite.

In any given embodiment, the BTS may have none, some, or all of these properties. Advantageously, in an embodiment where an enclosure suitable for outdoor deployment houses a base station suitable for indoor deployment, the enclosure need only meet, for example, seismic and waterproofing requirements, while the base station suitable for indoor deployment may have already been configured to meet other requirements.

While this invention has been described in terms of certain embodiments, it will be appreciated by those skilled in the art that certain modifications, permutations and equivalents thereof are within the inventive scope of the present invention. It is therefore intended that the following appended claims include all such modifications, permutations and equivalents as fall within the true spirit and scope of the present invention.

What is claimed is:

1. A system, comprising:
an enclosure, suitable for use outside in a wide range of extreme weather conditions, with at least two compartments;
a first door operationally coupled to the enclosure such that a first of the two compartments can be opened, the first door including:
a controller;
a filtration unit for filtering particles and water droplets from air;
a fan tray with a heater for drawing in and heating air;
one or more cold start recirculation dampers for controlling the flow of heated air;
a second door operationally coupled to the enclosure such that a second of the two compartments can be opened;
communications equipment, suitable for use indoors over a limited temperature range, within the first compartment;
a rectifier unit within the second compartment;
wherein, in operation, the controller controls the fan tray with a heater to pull ambient air through the filtration unit, through the fan tray where the air is heated, and through the cold start recirculation dampers,
wherein a first portion of the heated air contacts the communications equipment and a second portion of the heated air contacts the rectifier unit as the air passes through the first compartment and the second compartment, respectively,
wherein, when a portion of the communications equipment passes a lower threshold temperature, the communications equipment is started, thereby preventing the communications equipment from starting at a temperature that is sufficiently cold to potentially damage components of the communications equipment,
wherein, when a portion of the communications equipment passes an upper threshold temperature the controller increases the speed of the fans in the fan tray, thereby drawing more ambient air through the filtration unit to prevent the communications equipment from overheating.

2. A device, comprising:
a first thermistor input associated with an input air flow;
a second thermistor input associated with an exhaust air flow;
a fan control output;
a heater control output;
a controller capable of coupling to a first thermistor through the first thermistor input, a second thermistor through the second thermistor input, one or more fans through the fan control output, and one or more heaters through the heater control output,
wherein, in operation, the controller:
turns on at least one of the heaters when the first thermistor senses a first cold temperature and the second thermistor senses a second cold temperature;
turns off the heaters when the second thermistor measures a warm temperature;
adjusts the speed of the fans based upon the temperature sensed by the second thermistor, wherein fan speed is generally higher when the temperature sensed by the second thermistor is higher.

3. The device of claim 2, wherein the warm temperature is 10 degrees C. or higher.

4. The device of claim 2, wherein the first cold temperature is 0 degrees C. or lower.

5. The device of claim 2, wherein the second cold temperature is 0 degrees C. or lower.

6. The device of claim 2, wherein the second cold temperature is 10 degrees C. or lower.

7. The device of claim 2, wherein the at least one of the heaters is a first heater, and wherein the controller turns on a second heater after an initial delay, during which the controller turns on the first heater.

* * * * *